(12) United States Patent
Li et al.

(10) Patent No.: US 8,760,822 B1
(45) Date of Patent: Jun. 24, 2014

(54) METHOD AND SYSTEM FOR PROVIDING A READ TRANSDUCER HAVING AN EXTENDED PINNED LAYER AND SOFT MAGNETIC BIAS STRUCTURES WITH IMPROVED STABILITY

(71) Applicant: Western Digital (Fremont), LLC, Fremont, CA (US)

(72) Inventors: Guanxiong Li, Fremont, CA (US); Ming Mao, Dublin, CA (US); Chih-Ching Hu, Pleasanton, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 13/688,043

(22) Filed: Nov. 28, 2012

(51) Int. Cl.
*G11B 5/127* (2006.01)

(52) U.S. Cl.
USPC ............................................. 360/324.11

(58) Field of Classification Search
USPC ................ 360/324.11, 324.12, 324.1, 324.2
See application file for complete search history.

(56) References Cited

U.S. PATENT DOCUMENTS

| | | | |
|---|---|---|---|
| 5,612,098 A | 3/1997 | Tan et al. | |
| 5,717,550 A | 2/1998 | Nepela et al. | |
| 5,828,530 A | 10/1998 | Gill et al. | |
| 5,876,848 A | 3/1999 | Tan et al. | |
| 5,898,547 A | 4/1999 | Fontana, Jr. et al. | |
| 6,219,205 B1 | 4/2001 | Yuan et al. | |
| 6,456,465 B1 | 9/2002 | Louis et al. | |
| 6,466,419 B1 | 10/2002 | Mao | |
| 6,597,546 B2 | 7/2003 | Gill | |
| 6,631,055 B2 | 10/2003 | Childress et al. | |
| 6,680,828 B2 | 1/2004 | Gill | |
| 6,680,830 B2 | 1/2004 | Gill | |
| 6,724,584 B2 | 4/2004 | Mack et al. | |
| 6,738,236 B1 | 5/2004 | Mao et al. | |
| 6,738,237 B2 | 5/2004 | Gill | |
| 6,741,432 B2 | 5/2004 | Pinarbasi | |
| 6,744,607 B2 | 6/2004 | Freitag et al. | |
| 6,751,845 B2 | 6/2004 | Gill | |
| 6,781,798 B2 | 8/2004 | Gill | |
| 6,785,102 B2 | 8/2004 | Freitag et al. | |
| 6,801,412 B2 | 10/2004 | Gill | |
| 6,833,982 B2 | 12/2004 | Jayasekara | |
| 6,847,510 B2 | 1/2005 | Childress et al. | |
| 6,856,493 B2 | 2/2005 | Pinarbasi | |
| 6,859,348 B2 | 2/2005 | Pinarbasi | |
| 6,865,062 B2 | 3/2005 | Pinarbasi | |
| 6,867,952 B2 | 3/2005 | Hasegawa | |
| 6,867,953 B2 | 3/2005 | Gill | |
| 6,901,652 B2 | 6/2005 | Hasegawa et al. | |
| 6,933,042 B2 | 8/2005 | Gill | |
| 6,943,997 B2 | 9/2005 | Gill | |

(Continued)

*Primary Examiner* — Allen T Cao

(57) ABSTRACT

A method and system provide a magnetic transducer having an air-bearing surface (ABS). The magnetic transducer includes a first shield, a read sensor, at least one soft magnetic bias structure and a second shield. The read sensor includes a sensor layer, a pinned layer and edge(s). The sensor layer has a first stripe height in a stripe height direction perpendicular to the ABS. The pinned layer has a second stripe height in the stripe height direction. The second stripe height is greater than the first stripe height. The soft magnetic bias structure(s) are adjacent to the edge(s) of the sensor. A portion of the soft magnetic bias structure(s) is further from the ABS than the first stripe height. The read sensor is between the first shield and the second shield. The soft magnetic bias structure(s) extend to the second shield.

14 Claims, 13 Drawing Sheets

(56) References Cited

U.S. PATENT DOCUMENTS

| | | |
|---|---|---|
| 6,947,264 B2 | 9/2005 | Gill |
| 6,983,530 B2 | 1/2006 | Gill |
| 7,016,168 B2 | 3/2006 | Li et al. |
| 7,035,059 B2 | 4/2006 | Gill |
| 7,035,062 B1 | 4/2006 | Mao et al. |
| 7,037,847 B2 | 5/2006 | Le et al. |
| 7,038,889 B2 | 5/2006 | Freitag et al. |
| 7,050,277 B2 | 5/2006 | Gill et al. |
| 7,072,154 B2 | 7/2006 | Gill et al. |
| 7,082,017 B2 | 7/2006 | Freitag et al. |
| 7,092,220 B2 | 8/2006 | Gill et al. |
| 7,092,221 B2 | 8/2006 | Gill |
| 7,094,130 B2 | 8/2006 | Cyrille et al. |
| 7,161,773 B2 | 1/2007 | Fontana, Jr. et al. |
| 7,171,741 B2 | 2/2007 | Gill |
| 7,177,120 B2 | 2/2007 | Freitag et al. |
| 7,196,878 B2 | 3/2007 | Fox et al. |
| 7,212,384 B1 | 5/2007 | Stoev et al. |
| 7,220,499 B2 | 5/2007 | Saito et al. |
| 7,245,463 B2 | 7/2007 | Gill |
| 7,248,447 B2 | 7/2007 | Gill |
| 7,265,946 B2 | 9/2007 | Gill |
| 7,268,980 B2 | 9/2007 | Gill |
| 7,280,325 B1 | 10/2007 | Pan |
| 7,313,856 B2 | 1/2008 | Gill |
| 7,324,310 B2 | 1/2008 | Gill |
| 7,330,339 B2 | 2/2008 | Gill |
| 7,345,854 B2 | 3/2008 | Takano |
| 7,365,949 B2 | 4/2008 | Hayakawa et al. |
| 7,369,371 B2 | 5/2008 | Freitag et al. |
| 7,370,404 B2 | 5/2008 | Gill et al. |
| 7,372,674 B2 | 5/2008 | Gill |
| 7,382,589 B2 | 6/2008 | Lin et al. |
| 7,405,908 B2 | 7/2008 | Gill |
| 7,405,909 B2 | 7/2008 | Gill |
| 7,419,610 B2 | 9/2008 | Cyrille et al. |
| 7,420,787 B2 | 9/2008 | Freitag et al. |
| 7,420,788 B2 | 9/2008 | Pinarbasi |
| 7,436,637 B2 | 10/2008 | Pinarbasi |
| 7,436,638 B1 | 10/2008 | Pan |
| 7,463,459 B2 | 12/2008 | Ding et al. |
| 7,466,524 B2 | 12/2008 | Freitag et al. |
| 7,469,465 B2 | 12/2008 | Ding et al. |
| 7,522,391 B2 | 4/2009 | Freitag et al. |
| 7,522,392 B2 | 4/2009 | Carey et al. |
| 7,580,230 B2 | 8/2009 | Freitag et al. |
| 7,599,155 B2 | 10/2009 | Saito et al. |
| 7,602,589 B2 | 10/2009 | Freitag et al. |
| 7,616,411 B2 | 11/2009 | Gill |
| 7,652,856 B2 | 1/2010 | Pinarbasi |
| 7,663,846 B2 | 2/2010 | Freitag et al. |
| 7,676,905 B2 | 3/2010 | Pinarbasi |
| 7,697,242 B2 | 4/2010 | Gill |
| 7,800,867 B2 | 9/2010 | Saito et al. |
| 7,916,435 B1 | 3/2011 | Gill |
| 7,961,440 B2 | 6/2011 | Gill et al. |
| 8,068,317 B2 | 11/2011 | Gill |
| 8,104,166 B1 | 1/2012 | Zhang et al. |
| 8,149,548 B2 | 4/2012 | Hatatani et al. |
| 8,233,248 B1 | 7/2012 | Li et al. |
| 8,266,785 B2 | 9/2012 | Freitag et al. |
| 8,318,030 B2 | 11/2012 | Peng et al. |
| 8,333,898 B2 | 12/2012 | Brown et al. |
| 8,343,319 B1 | 1/2013 | Li et al. |
| 8,400,738 B2 | 3/2013 | Covington et al. |
| 8,531,801 B1 * | 9/2013 | Xiao et al. ............ 360/319 |
| 2002/0131219 A1 | 9/2002 | Mack et al. |
| 2003/0123198 A1 | 7/2003 | Sugawara et al. |
| 2003/0179520 A1 | 9/2003 | Hasegawa |
| 2004/0061983 A1 | 4/2004 | Childress et al. |
| 2004/0166368 A1 | 8/2004 | Gill et al. |
| 2006/0023375 A1 | 2/2006 | Gill |
| 2006/0092582 A1 | 5/2006 | Gill et al. |
| 2006/0230601 A1 | 10/2006 | Gill et al. |
| 2006/0232893 A1 | 10/2006 | Gill et al. |
| 2006/0285259 A1 | 12/2006 | Gill et al. |
| 2008/0180863 A1 | 7/2008 | Gill |
| 2009/0086385 A1 | 4/2009 | Gill et al. |
| 2009/0316308 A1 | 12/2009 | Saito et al. |
| 2010/0232072 A1 | 9/2010 | Dimitrov et al. |
| 2011/0228428 A1 | 9/2011 | Dimitrov et al. |
| 2012/0134057 A1 | 5/2012 | Song et al. |
| 2012/0276415 A1 | 11/2012 | Sapozhnikov et al. |
| 2013/0082696 A1 | 4/2013 | Le et al. |
| 2013/0092654 A1 | 4/2013 | Balamane et al. |

* cited by examiner

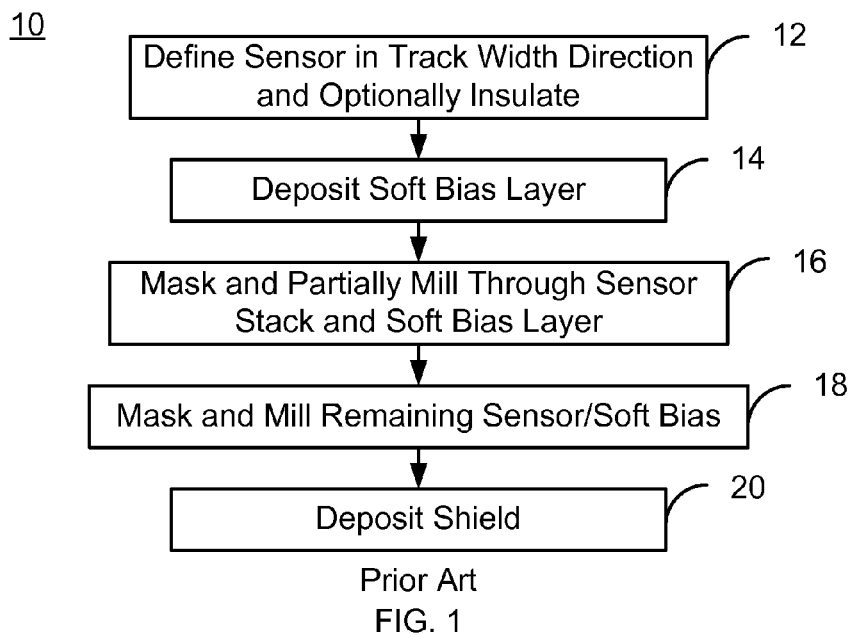
Prior Art
FIG. 1
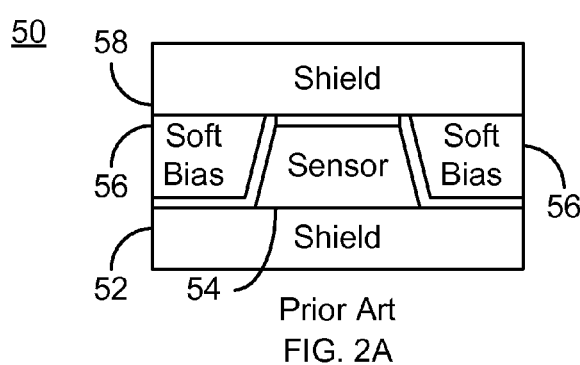
Prior Art
FIG. 2A
Prior Art
FIG. 2B
Prior Art
FIG. 2C

METHOD AND SYSTEM FOR PROVIDING A READ TRANSDUCER HAVING AN EXTENDED PINNED LAYER AND SOFT MAGNETIC BIAS STRUCTURES WITH IMPROVED STABILITY

BACKGROUND

FIG. 1 depicts a conventional method 10 for fabricating a read transducer that uses soft magnetic biasing. The method 10 starts after the first shield has been provided and the layers for the sensor are deposited. The sensor is defined in the track width direction, via step 12. Step 12 typically includes providing a first mask that covers the desired portion of the sensor layers in the track width direction and milling the exposed portions of the sensor layers. In addition, an insulating layer may be deposited. The soft bias layer is deposited, via step 14. The insulating layer electrically insulates the sensor from the soft bias material(s). The first mask may then be removed.

The read sensor is then masked and partially milled through, via step 16. The first conventional milling mask used in step 16 sets the stripe height of the free layer. The stripe height of the free layer is the distance the free layer extends from the ABS in a direction perpendicular to the ABS. The soft bias layer is also milled in step 16. The mask used in step 16 is substantially rectangular in shape and covers both the sensor and the soft bias layer. Both the soft bias layer and the sensor are partially milled through. Thus, the unmilled portion of the soft bias layer and the free layer have substantially the same stripe height. Once the read sensor is milled to the desired depth, step 16 terminates and the first conventional milling mask is removed.

A second conventional milling mask is provided and the remaining portion of the sensor layers and the soft bias layers are milled, via step 18. In step 18, the stripe height of the pinned layer is set. The conventional second milling mask used in step 18 is also rectangular in shape, but typically extends further from the ABS than the first conventional milling mask. As a result, the pinned layer extends further from the ABS than the free layer. The second conventional milling mask covers some portion of the soft bias layer. As a result, an exposed portion of the soft bias layer continues to be milled, but a covered portion is not. Once step 18 is completed, the second conventional milling mask is removed. The second shield is then deposited in step 20.

FIGS. 2A-2C depict an air-bearing surface (ABS) and side views of a conventional read transducer 50 which utilizes soft bias structures. The conventional read transducer 50 includes shields 52 and 58, sensor 54, soft bias structures 56. The read sensor 54 is typically a giant magnetoresistive (GMR) sensor or tunneling magnetoresistive (TMR) sensor. The read sensor 54 includes an antiferromagnetic (AFM) layer, a pinned layer, a nonmagnetic spacer layer, and a free layer, which are not shown for simplicity. Also shown is a capping layer. In addition, seed layer(s) may be used. The free layer has a magnetization sensitive to an external magnetic field. Thus, the free layer functions as a sensor layer for the magnetoresistive sensor 54. Consequently, as used herein a sensor layer is typically a free layer. The soft bias structures 56 are used to magnetically bias the sensor layer of the sensor 54.

As can be seen in FIG. 2B, the conventional free layer of the conventional sensor 58 has a first stripe height, h1. This height is on the order of forty to fifty nanometers. This stripe height h1 was formed in step 16. The conventional extended pinned layer has a greater stripe height, h2. The second stripe height h2 of the extended pinned layer is defined in step 18. The conventional soft bias structures 56 extend to the second shield 58 and have a stripe height h1. The conventional soft bias structures 56 are defined in step 16.

Although the conventional transducer 50 functions, there are drawbacks. After fabrication is complete, residue 57 from the soft bias layer deposited in step 14 still remains. The residue 57 is present because the soft bias layer and sensor are not completely milled through in step 16. The residue is thus prevented from being milled by the mask used in step 18. The residue 57 is magnetically connected to the adjoining conventional soft magnetic bias structure 56. The conventional soft bias structures 56 are connected to the conventional shield 58. However, the conventional soft bias structures 56 extend only to h1, which is typically on the order of forty nanometers. Further, the residue 57 does not extend to the shield 58. The residue 57 is thus not stabilized by the shield 58. The residue 57 is thus magnetically unstable. Such instabilities adversely affect reliability of the conventional read transducer 50.

Accordingly, what is needed is a system and method for improving the reliability of a magnetic recording read transducer.

BRIEF SUMMARY OF THE INVENTION

A method and system provide a magnetic transducer having an air-bearing surface (ABS). The magnetic transducer includes a first shield, a read sensor, at least one soft magnetic bias structure and a second shield. The read sensor includes a sensor layer, a pinned layer and edge(s). The sensor layer has a first stripe height in a stripe height direction perpendicular to the ABS. The pinned layer has a second stripe height in the stripe height direction. The second stripe height is greater than the first stripe height. The soft magnetic bias structure(s) are adjacent to the edge(s) of the sensor. A portion of the soft magnetic bias structure(s) is further from the ABS than the first stripe height. The read sensor is between the first shield and the second shield. The soft magnetic bias structure(s) extend to the second shield.

BRIEF DESCRIPTION OF SEVERAL VIEWS OF THE DRAWINGS

FIG. 1 depicts a conventional method for fabricating a read transducer.

FIGS. 2A-2C depict ABS and side views of a conventional magnetic recording read transducer.

DETAILED DESCRIPTION OF THE PREFERRED EMBODIMENTS

Figure 3:
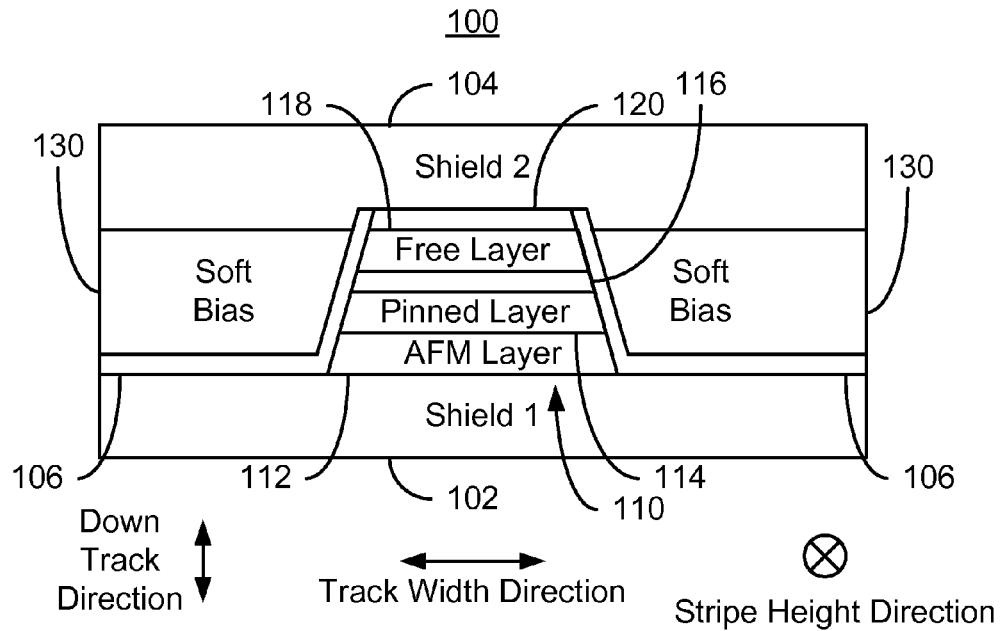
FIG. 3 is an ABS view of an exemplary embodiment of a portion of a magnetic recording read transducer.
Figure 4:
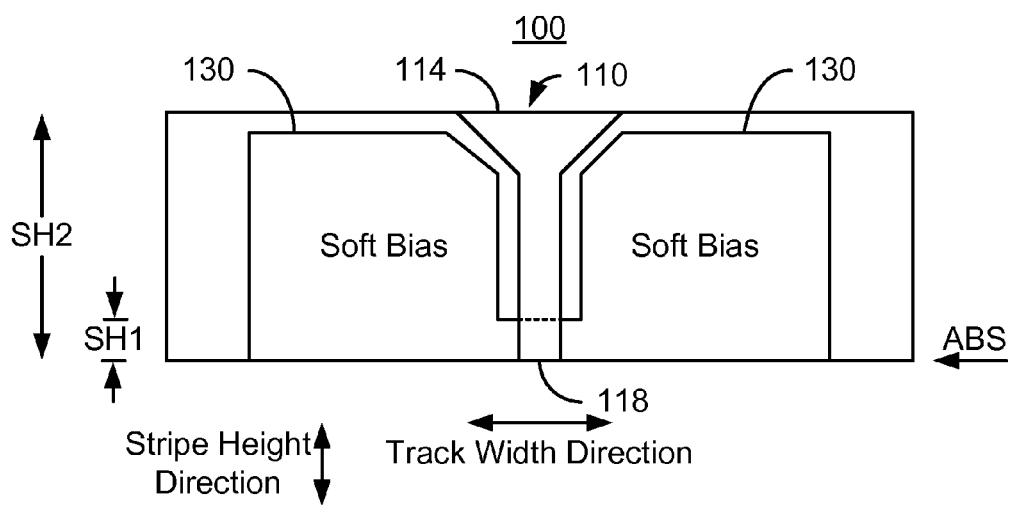
FIG. 4 is a plan view of an exemplary embodiment of a portion of a magnetic recording read transducer.

FIGS. 3-4 depict ABS and plan views, respectively, of an exemplary embodiment of a portion of a magnetic read transducer 100. For clarity, FIGS. 3 and 4 are not to scale. The read transducer 100 may be part of a read head or may be part of a merged head that also includes a write transducer. The head of which the read transducer 100 is a part is part of a disk drive having a media, a slider and the head coupled with the slider. The read transducer 100 is also described in the context of particular components. In other embodiments, some of the components may be omitted, provided in a different location, or have different constituents. Further, other components may be used.

The transducer 100 includes shields 102 and 104, insulator 106, a read sensor 110 and soft magnetic bias structures 130. For clarity, the insulator 106 is not shown in the plan view. The sensor 110 shown is a GMR or TMR sensor. Thus, the sensor 110 includes a pinning layer 112, a pinned layer 114, a nonmagnetic spacer layer 116, a free layer 118, and a capping layer 120. The sensor 110 may also include seed layer(s) (not shown). Although an AFM layer 112 used to pin the magnetic moment of the pinned layer 116 is shown, in other embodiments, the pinning layer may be omitted or may use a different pinning mechanism. The pinned layer 114 and free layer 118 are each shown as a single layer, but may include multiple layers including but not limited to a synthetic antiferromagnetic (SAF) structure. The nonmagnetic spacer layer 116 may be a conductive layer, a tunneling barrier layer, or other analogous layer. Although depicted as a GMR or TMR sensor, in other embodiments, other structures and other sensing mechanisms may be used for the sensor 110.

The soft magnetic bias structures 130 are made using soft magnetic material(s). In some embodiments, the soft magnetic bias structures 130 have a high permeability and a coercivity of less than ten Oe. In some such embodiments, the soft magnetic bias structures 130 have a coercivity of not more than five Oe. For example, the soft magnetic bias structures 130 may include NiFe, such as Permalloy. Because the soft magnetic bias structures 130 have a magnetic moment, the soft magnetic bias structures 130 magnetically bias the free layer 118. The soft magnetic bias structures 130 are separated from the sensor 110 by insulating layer 106. Thus, the soft magnetic bias structures 130 are adjacent to the sides of the sensor 110. However, in other embodiments, the insulting layer might be omitted. In the embodiment shown in FIG. 3, the soft magnetic bias structures 130 are also shown as separated from the shield 102 by nonmagnetic layers 106. Thus, the soft magnetic bias structures 130 are magnetically decoupled from the shield 102. However, in alternate embodiments, one or both of the soft magnetic bias structures 130 may be connected the shield 102 for example by omitting the layer 106.

As can be seen in FIG. 4, the free layer 118 has a stripe height SH1, while the pinned layer 114 has a stripe height SH2. In some embodiments, the stripe height SH1 may be not more than forty nanometers. The stripe height SH1 is approximately thirty through forty nanometers in some such embodiments. The stripe height SH2 of the pinned layer 114 is greater than the stripe height SH1. Thus, the read sensor 110 has an extended pinned layer. In addition, the soft bias structures 130 extend further from the ABS than the stripe height SH1. More specifically, the portion of the soft bias structures 130 that extends to the shield 104 also extends further from the ABS than the free layer 118. In the embodiment shown, the entirety of the soft bias structures 130 extends to the shield 104 and extends from the ABS in the stripe height direction a distance that is greater than SH1. In the embodiment shown, the soft bias structures 130 do not extend to SH2. However, in other embodiments, the soft bias structures 130 might extend as far as or farther from the ABS than the pinned layer 114. Further, although a particular geometry of the soft bias structures is shown, other geometries may be possible. For example, although each of the soft bias structures is shown as a single monolithic piece, in other embodiments, the soft bias structures 130 on either side of the sensor 110 in the track width direction may include multiple pieces. The soft bias structures 130 are also shown as being symmetric with respect to the sensor 110. In other embodiments, the soft bias structures 130 may not be symmetric. In addition, in FIG. 4, the soft bias structures 130 are shown as being substantially conformal with the edges of the sensor 110. However, in other embodiments, the soft bias structures 130 may have another shape.

The magnetic junction 100 may have improved reliability. The soft bias structures 130 extend to the shield 104 in the down track direction and extend further from the ABS than the stripe height SH1. A significantly larger portion of the soft bias structures 130 are thus connected to the shield 104. As a result, the soft bias structures 130 are more stable. Further, the presence of residue (not shown in FIG. 4) may be reduced or eliminated. Magnetic stability of the read transducer 100 is thus improved. Consequently, reliability of the read transducer 100 may also be enhanced.

Figure 5:
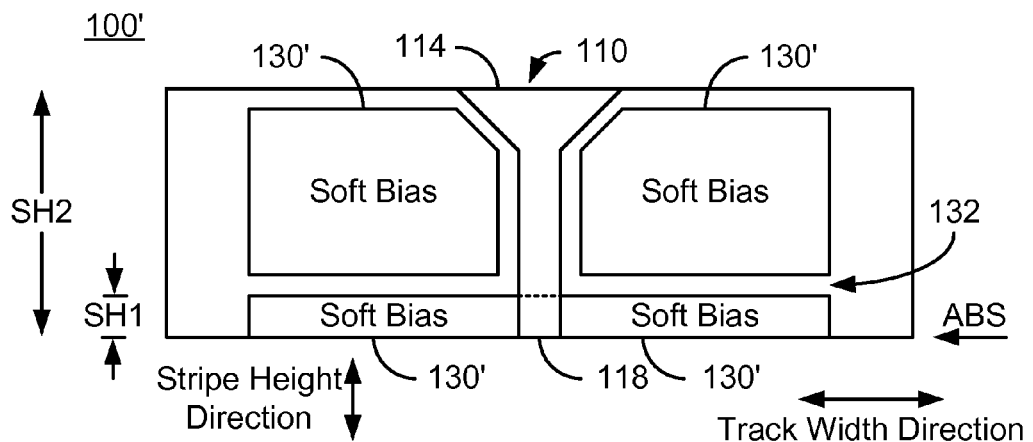
FIG. 5 is a plan view of another exemplary embodiment of a portion of a magnetic recording read transducer.

FIG. 5 depicts a plan view of another exemplary embodiment of a magnetic read transducer 100'. The magnetic read transducer 100' is analogous to the magnetic read transducer 100. The ABS view shown in FIG. 3 may thus correspond to the plan view depicted in FIG. 5. Referring to FIGS. 3 and 5, the magnetic transducer 100' includes sensor 110 having a pinned layer 114 and free layer 118 that are analogous to the sensor 110, pinned layer 114 and free layer 118 depicted in FIG. 3. Although not labeled, the magnetic transducer 100' may also include shields, insulating layer, other portions of the read sensor 110 analogous to the shields 102 and 104, insulting layer 106, and components 112, 116 and 120 of the read sensor 110 depicted in FIG. 3. The sensor 110 depicted in FIG. 5 thus has a free layer 118 having a stripe height SH1 and an extended pinned layer 114 having a stripe height SH2 that is greater than SH1.

The magnetic transducer 100' also includes soft bias structures 130' that are analogous to the soft bias structures 130. Thus, the soft magnetic bias structures 130' may be formed of similar materials and have an analogous function. The soft bias structures 130' magnetically bias the sensor layer 118. The soft magnetic bias structures 130' may be separated from the sensor 110 by insulating layer (not labeled in FIG. 5). In other embodiments, however, the insulating layer might be omitted. The soft magnetic bias structures 130' may also be separated from the shield 102 by nonmagnetic layer (not shown in FIG. 5). Thus, the soft magnetic bias structures 130' are magnetically decoupled from the shield 102. However, in alternate embodiments, one or both of the soft magnetic bias structures 130' may be connected the shield 102 for example by omitting the layer 106. In addition, the soft bias structures 130' extend to and are magnetically coupled with the shield 104.

The magnetic bias structures 130' on each side of the sensor 110 in the track width direction include multiple sections separated by gaps 132. Thus, some of the soft bias structures 130' occupy a part of the ABS and terminate at the distance SH1 from the ABS. Other soft magnetic bias structures 130' reside a distance greater than SH1 from the ABS.

The magnetic junction 100' may have improved reliability. The soft bias structures 130' extend to the shield 104 in the down track direction and extend further from the ABS than the stripe height SH1. A significantly larger portion of the soft bias structures 130' are thus connected to the shield 104. As a result, the soft bias structures 130' are more stable. Further, the presence of residue (not shown in FIG. 5) may be reduced or eliminated. Stability and, therefore, reliability of the magnetic transducer is thus improved.

Figure 6:
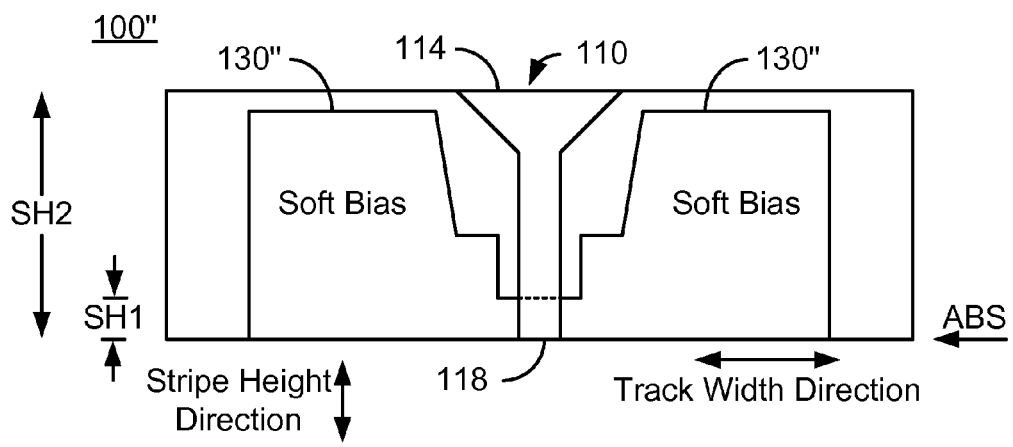
FIG. 6 is a plan view of another exemplary embodiment of a portion of a magnetic recording read transducer.

FIG. 6 depicts a plan view of another exemplary embodiment of a magnetic read transducer 100". The magnetic read transducer 100" is analogous to the magnetic read transducers 100 and 100'. The ABS view shown in FIG. 3 may thus correspond to the plan view depicted in FIG. 6. Referring to FIGS. 3 and 6, the magnetic transducer 100" includes sensor 110 having a pinned layer 114 and free layer 118 that are analogous to the sensor 110, pinned layer 114 and free layer 118 depicted in FIG. 3. Although not labeled, the magnetic transducer 100" may also include shields, insulating layer, other portions of the read sensor 110 analogous to the shields 102 and 104, insulting layer 106, and components 112, 116 and 120 of the read sensor 110 depicted in FIG. 3. The sensor 110 depicted in FIG. 6 thus has a free layer 118 having a stripe height SH1 and an extended pinned layer 114 having a stripe height SH2 that is greater than SH1.

The magnetic transducer 100" also includes soft bias structures 130" that are analogous to the soft bias structures 130 and/or 130'. Thus, the soft magnetic bias structures 130" may be formed of similar materials and have an analogous function. The soft bias structures 130" magnetically bias the sensor layer 118. The soft magnetic bias structures 130" may be separated from the sensor 110 by insulating layer (not labeled in FIG. 6). In other embodiments, however, the insulating layer might be omitted. The soft magnetic bias structures 130" may also be separated from the shield 102 by nonmagnetic layer (not shown in FIG. 6). Thus, the soft magnetic bias structures 130" are magnetically decoupled from the shield 102. However, in alternate embodiments, one or both of the soft magnetic bias structures 130" may be connected the shield 102 for example by omitting the layer 106. In addition, the soft bias structures 130" extend to and are magnetically coupled with the shield 104.

Portions of the magnetic bias structures 130" on each side of the sensor 110 in the track width direction are not conformal to the edges of the sensor 110. For example, near the ABS, the soft bias structures are conformal with the sensor 110. However, further from the ABS, for example closer to a depth of SH2, the magnetic bias structures 130" are not conformal. However, portions of the soft bias structures 130" are still at a distance greater than SH1 from the ABS.

The magnetic junction 100" may have improved reliability. The soft bias structures 130" extend to the shield 104 in the down track direction and extend further from the ABS than the stripe height SH1. A significantly larger portion of the soft bias structures 130" are thus connected to the shield 104. As a result, the soft bias structures 130" are more stable. Further, the presence of residue (not shown in FIG. 6) may be reduced or eliminated. Stability and, therefore, reliability of the magnetic transducer is thus improved.

Figure 7:
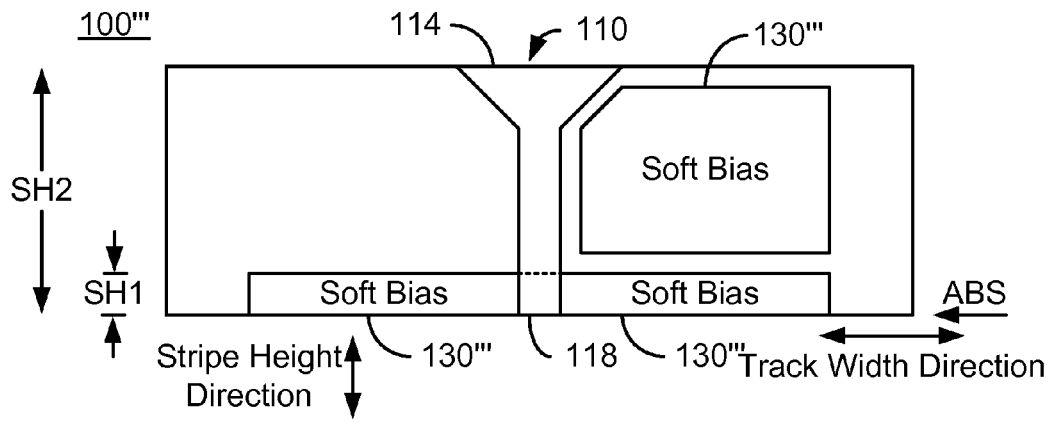
FIG. 7 is a plan view of another exemplary embodiment of a portion of a magnetic recording read transducer.

FIG. 7 depicts a plan view of another exemplary embodiment of a magnetic read transducer 100'". The magnetic read transducer 100'" is analogous to the magnetic read transducers 100, 100' and 100". The ABS view shown in FIG. 3 may thus correspond to the plan view depicted in FIG. 7. Referring to FIGS. 3 and 7, the magnetic transducer 100'" includes sensor 110 having a pinned layer 114 and free layer 118 that are analogous to the sensor 110, pinned layer 114 and free layer 118 depicted in FIG. 3. Although not labeled in FIG. 7, the magnetic transducer 100'" may also include shields, insulating layer, other portions of the read sensor 110 analogous to the shields 102 and 104, insulting layer 106, and components 112, 116 and 120 of the read sensor 110 depicted in FIG. 3. The sensor 110 depicted in FIG. 7 thus has a free layer 118 having a stripe height SH1 and an extended pinned layer 114 having a stripe height SH2 that is greater than SH1.

The magnetic transducer 100'" also includes soft bias structures 130'" that are analogous to the soft bias structures 130, 130' and/or 130". Thus, the soft magnetic bias structures 130'" may be formed of similar materials and have an analogous function. The soft bias structures 130'" magnetically bias the sensor layer 118. The soft magnetic bias structures 130'" may be separated from the sensor 110 by insulating layer (not labeled in FIG. 7). In other embodiments, however, the insulating layer might be omitted. The soft magnetic bias structures 130'" may also be separated from the shield 102 by nonmagnetic layer (not shown in FIG. 7). Thus, the soft magnetic bias structures 130'" are magnetically decoupled from the shield 102. However, in alternate embodiments, one or both of the soft magnetic bias structures 130'" may be connected the shield 102 for example by omitting the layer 106. In addition, the soft bias structures 130'" extend to and are magnetically coupled with the shield 104.

The magnetic bias structures 130'" are not symmetric with respect to the sensor 110. More specifically, on one side of the sensor 110, the soft bias structure 130'" only resides near the ABS at a distance not greater than SH1. On the opposite side, a portion of the soft bias structure 130'" is near the ABS at a distance not greater than SH1. However, an additional portion of the soft magnetic bias structure 130'" resides at a distance greater than SH1 from the ABS. Thus, portions of the soft bias structures 130'" are still at a distance greater than SH1 from the ABS.

The magnetic junction 100'" may have improved reliability. The soft bias structures 130'" extend to the shield 104 in the down track direction and extend further from the ABS than the stripe height SH1. A significantly larger portion of the soft bias structures 130'" are thus connected to the shield 104. As a result, the soft bias structures 130'" are more stable. Further, the presence of residue (not shown in FIG. 7) may be reduced or eliminated. Stability and, therefore, reliability of the magnetic transducer is thus improved.

Figure 8:
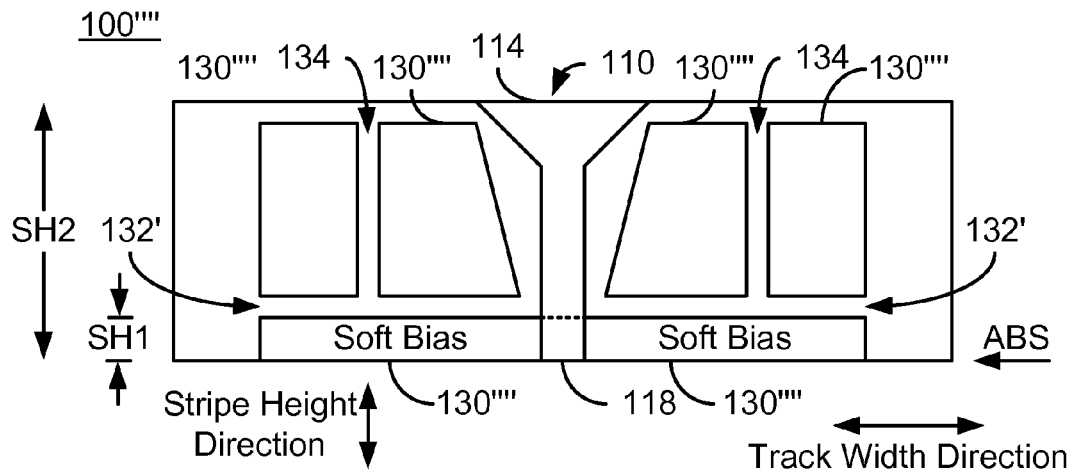
FIG. 8 is a plan view of another exemplary embodiment of a portion of a magnetic recording read transducer.

FIG. 8 depicts a plan view of another exemplary embodiment of a magnetic read transducer 100"". The magnetic read transducer 100"" is analogous to the magnetic read transducers 100, 100', 100" and 100'". The ABS view shown in FIG. 3 may thus correspond to the plan view depicted in FIG. 8. Referring to FIGS. 3 and 8, the magnetic transducer 100"" includes sensor 110 having a pinned layer 114 and free layer 118 that are analogous to the sensor 110, pinned layer 114 and free layer 118 depicted in FIG. 3. Although not labeled in FIG. 8, the magnetic transducer 100"" may also include shields, insulating layer, other portions of the read sensor 110 analogous to the shields 102 and 104, insulting layer 106, and components 112, 116 and 120 of the read sensor 110 depicted in FIG. 3. The sensor 110 depicted in FIG. 8 thus has a free layer 118 having a stripe height SH1 and an extended pinned layer 114 having a stripe height SH2 that is greater than SH1.

The magnetic transducer 100"" also includes soft bias structures 130"" that are analogous to the soft bias structures 130, 130', 130" and/or 130'". Thus, the soft magnetic bias structures 130"" may be formed of similar materials and have an analogous function. The soft bias structures 130"" magnetically bias the sensor layer 118. The soft magnetic bias structures 130"" may be separated from the sensor 110 by insulating layer (not labeled in FIG. 8). In other embodiments, however, the insulating layer might be omitted. The soft magnetic bias structures 130"" may also be separated from the shield 102 by nonmagnetic layer (not shown in FIG. 8). Thus, the soft magnetic bias structures 130"" are magnetically decoupled from the shield 102. However, in alternate embodiments, one or both of the soft magnetic bias structures 130"" may be connected the shield 102 for example by omitting the layer 106. In addition, the soft bias structures 130"" extend to and are magnetically coupled with the shield 104.

The magnetic bias structures 130"" include multiple separate pieces separated by gaps 132' and 134. However, some of the soft magnetic bias structures 130"" reside at a distance greater than SH1 from the ABS. Thus, portions of the soft bias structures 130"" are still at a distance greater than SH1 from the ABS.

The magnetic junction 100"" may have improved reliability. The soft bias structures 130"" extend to the shield 104 in the down track direction and extend further from the ABS than the stripe height SH1. A significantly larger portion of the soft bias structures 130"" are thus connected to the shield 104. As a result, the soft bias structures 130"" are more stable. Further, the presence of residue (not shown in FIG. 8) may be reduced or eliminated. Stability and, therefore, reliability of the magnetic transducer is thus improved.

Figure 9:
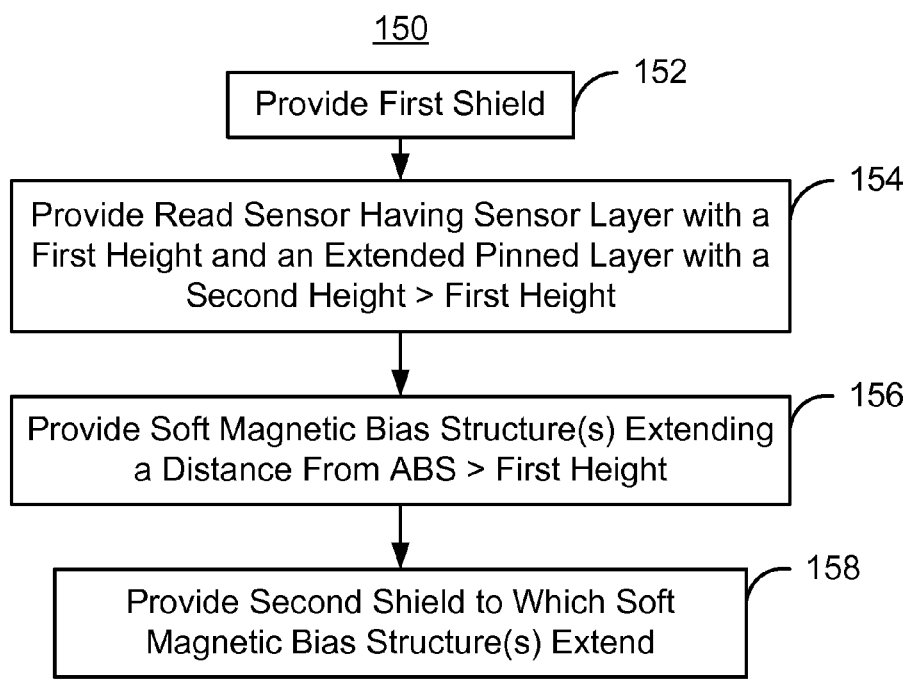
FIG. 9 is flow chart depicting an exemplary embodiment of a method for fabricating a portion of a magnetic recording read transducer.

FIG. 9 is an exemplary embodiment of a method 150 for providing a read transducer having an extended pinned layer and utilizing soft magnetic bias structures that include portion(s) that are farther from the ABS than the stripe height of the free layer. For simplicity, some steps may be omitted, interleaved, and/or combined. The method 150 is also described in the context of providing a single recording transducer 100 depicted in FIGS. 3-4. However, the method 150 may be used to fabricate multiple transducers at substantially the same time. The method 150 may also be used to fabricate other transducers including but not limited to any combination of 100', 100", 100''' and/or 100"". The method 150 is also described in the context of particular layers. A particular layer may include multiple materials and/or multiple sub-layers. The method 150 also may start after formation of other portions of the magnetic recording transducer.

The first shield 102 is provided, via step 152. Step 152 typically includes depositing a large high permeability layer. The sensor 110 having an extended pinned layer 114 is provided, via step 154. Step 154 typically includes depositing the layers for the sensor 110, then defining the sensor 110 in at least the track width direction using an ion mill. In some embodiments, the free layer 118 and pinned layer 114 of the sensor 110 are also defined in the stripe height direction. Thus, some the layers for the sensor are not completely milled through to provide an extended pinned layer 114. In some embodiments, the nonmagnetic spacer layer 116 also extends further from the ABS than the free layer 118. The insulator 106 may also be provided.

The soft magnetic bias structures 130 are provided, via step 156. Step 156 may include depositing the high permeability and any other material(s) for the soft magnetic bias structures 130 and defining the soft magnetic bias structures 130 in the track width and stripe height direction. In some embodiments, portions of steps 154 and 156 are interleaved. For example, portions of the sensor 110 may be defined in the stripe height direction as the soft magnetic bias structures are defined in the stripe height direction. Step 156 may also include depositing multiple layers for the soft magnetic bias structures 130. Further, in some embodiments, the soft magnetic bias structures 130 are provided such that they may be magnetically coupled to the shield 102 and/or 104.

The shield 104 may then be provided, via step 158. In some embodiments, the shield 104 may be magnetically coupled to the soft magnetic bias structures 130. Formation of the transducer 100 may then be completed.

Using the method 150, the transducers 100, 100', 100", 100''' and/or 100"" may be fabricated. Thus, the benefits of one or more of the transducers 100, 100', 100", 100''' and/or 100"" may be achieved.

Figure 10:
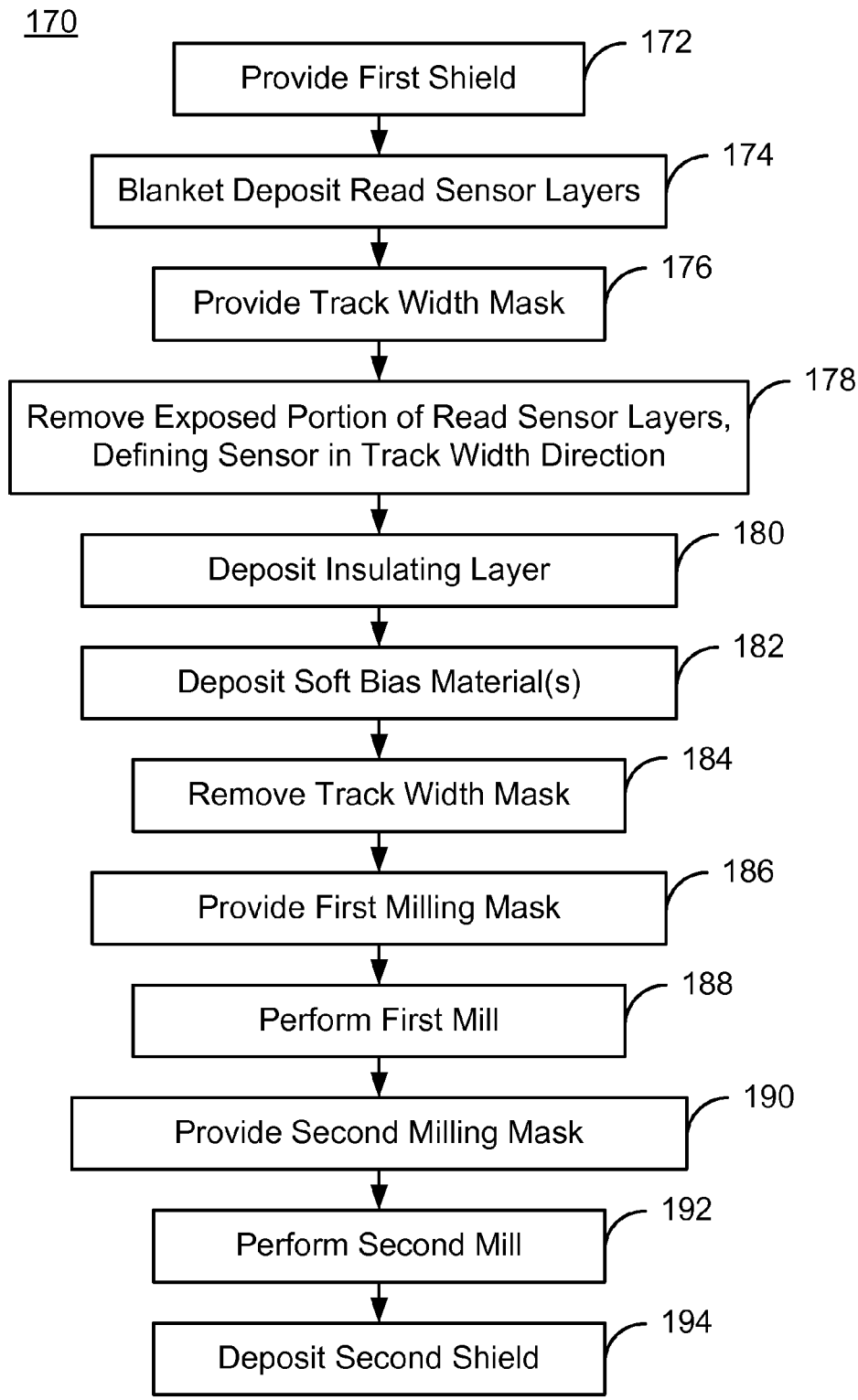
FIG. 10 is flow chart depicting another exemplary embodiment of a method for fabricating a portion of a magnetic recording read transducer.

FIG. 10 is a flow chart depicting another exemplary embodiment of a method 170 for fabricating a transducer using a damascene process. For simplicity, some steps may be omitted, interleaved, and/or combined. FIGS. 11-27 are diagrams various views of an exemplary embodiment of a portion of a transducer during 200 fabrication. For clarity, 11-25 are not to scale. Although some of FIGS. 11-27 depict the ABS location (location at which the ABS is to be formed) and ABS at a particular point in the pole, other embodiments may have other locations for the ABS. Referring to FIGS. 10-27, the method 170 is described in the context of the transducer 200. However, the method 170 may be used to form another device (not shown). The transducer 200 being fabricated may be part of a merged head that also includes a read head (not shown in 10—FIG. 27) and resides on a slider (not shown) in a disk drive. The method 170 also may commence after formation of other portions of the transducer 200. The method 170 is also described in the context of providing a single transducer 200. However, the method 170 may be used to fabricate multiple transducers at substantially the same time. The method 170 and device 200 are also described in the context of particular layers. However, in some embodiments, such layers may include multiple sublayers.

The first shield is provided, via step 172. Step 172 typically includes depositing a large high permeability layer. The layers for the read sensor are then deposited, via step 174. Typically, step 174 includes depositing a pinning layer such as an AFM layer, a pinned layer, a nonmagnetic spacer layer, a free layer and a capping layer. However, in other embodiments, other and/or different layers may be provided. The layers are blanket deposited in step 174. Thus, the layers cover a larger region than the read sensor will when completed.

Figure 11:
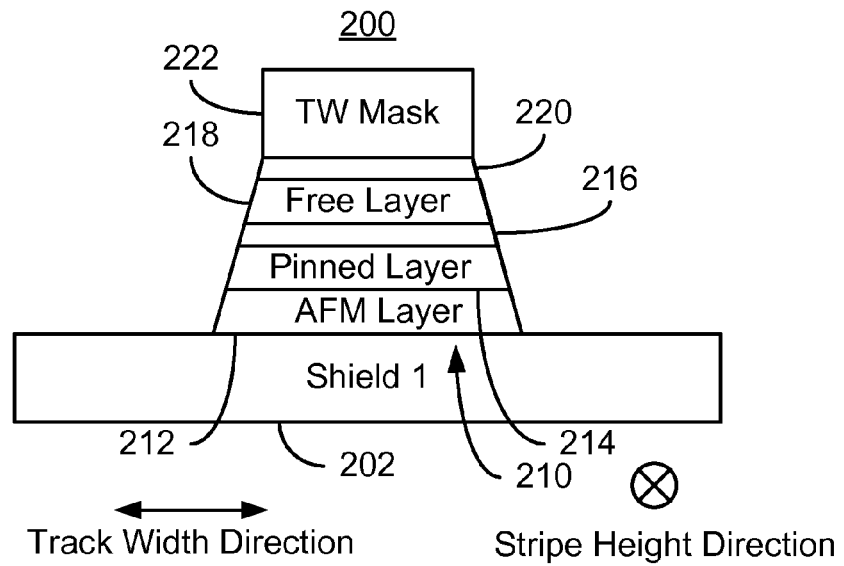
FIGS. 11-27 depict various views of another exemplary embodiment of a portion of a magnetic recording read transducer during fabrication.
Figure 12:
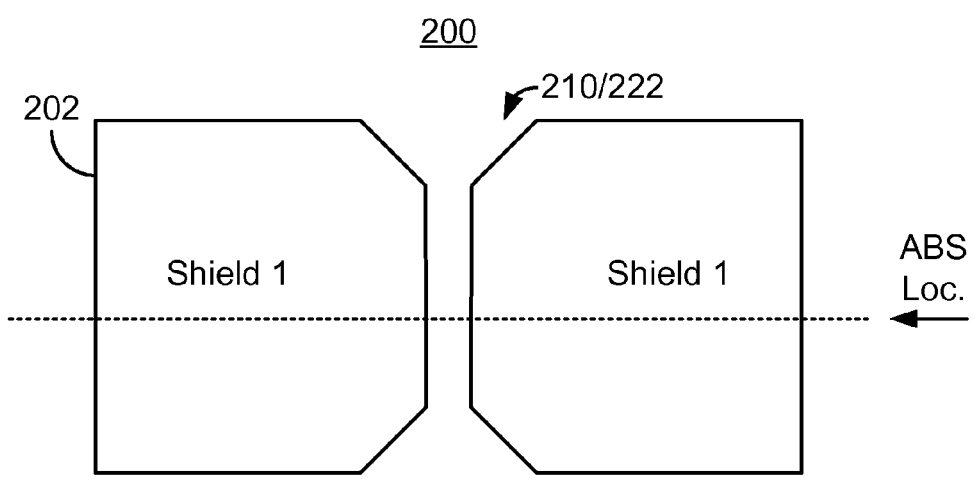

A track width mask that covers a portion of the read sensor layers is provided, via step 176. The track width mask is used to define the read sensor in the track width direction. For example, a photoresist mask, hard mask, some combination thereof or other mask may be used. An exposed portion of the read sensor layers is removed, via step 178. Step 178 may include ion milling the exposed portions of the read sensor layers. The exposed read sensor layers are generally desired to be completely removed. The read sensor is, therefore, defined in a track width direction. FIGS. 11-12 depict ABS and plan views of the transducer 200 after step 174 is performed. The transducer 200 includes a first shield 202 and a read sensor 210. The read sensor 210 includes an AFM pinning layer 212, a pinned layer 214, a nonmagnetic spacer layer 216, a free layer 218 and a capping layer 220. The nonmagnetic spacer layer 216 may be an insulating tunneling barrier layer, a conductor or other material(s). Also shown is the track width mask 224. Thus, as can be seen in FIGS. 11 and 12, the read sensor 210 has been defined in the track width direction.

Figure 13:
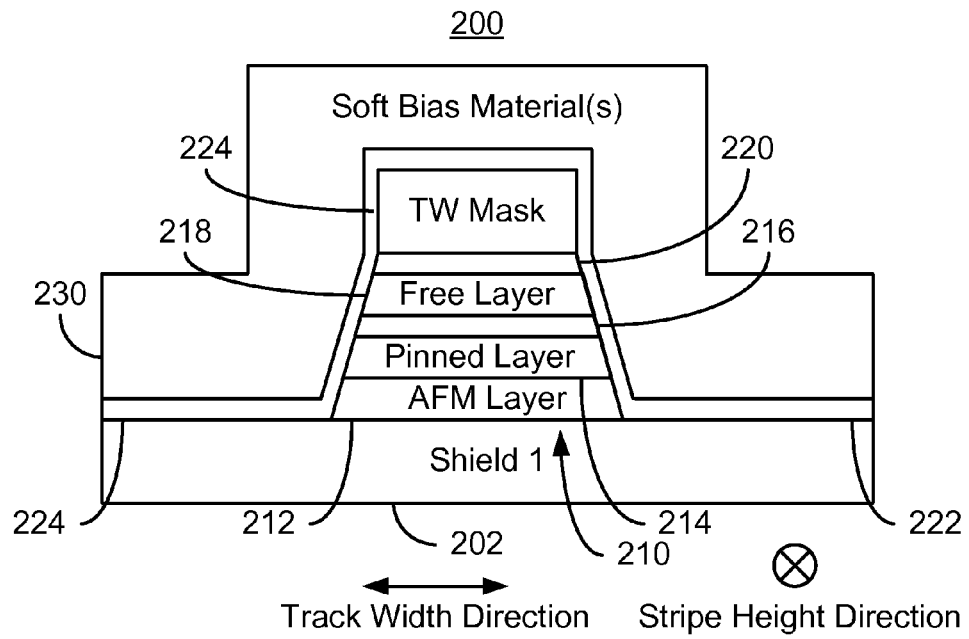
Figure 14:
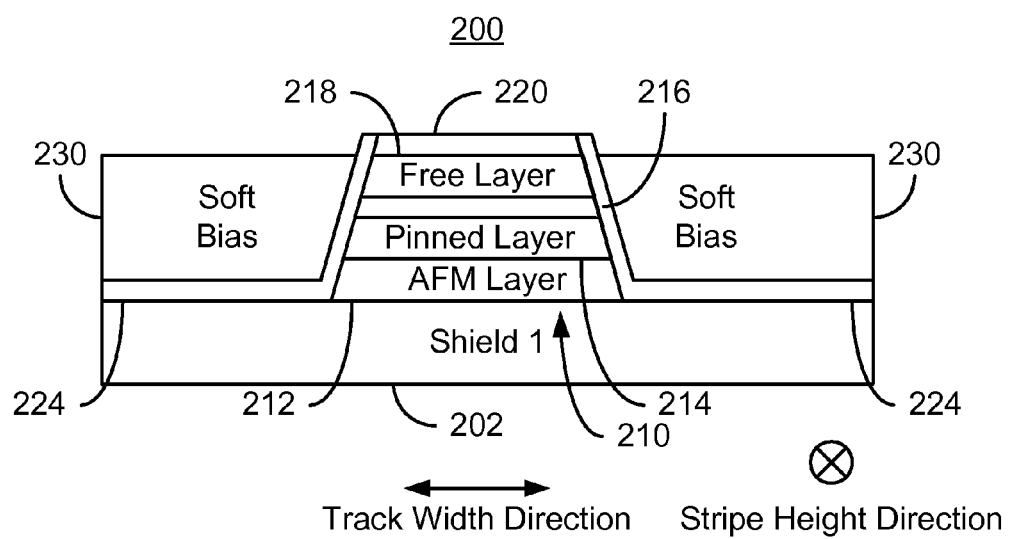

An insulating layer may then be deposited, via step 180. Material(s) for the soft bias are deposited, via step 182. FIG. 13 depicts the transducer 200 after step 182 is performed. Thus, an insulating layer 224 and soft bias material(s) 230 have been deposited. The layers 224 and 230 cover not only the sensor 210, but also the track width mask 224. The track width mask is then removed, for example by a lift-off procedure, via step 184. FIG. 14 depicts the transducer 200 after step 184 is performed. Thus, soft bias material(s) 230 and insulating layer 224 remain along the edges of the read sensor 210.

Figure 15:
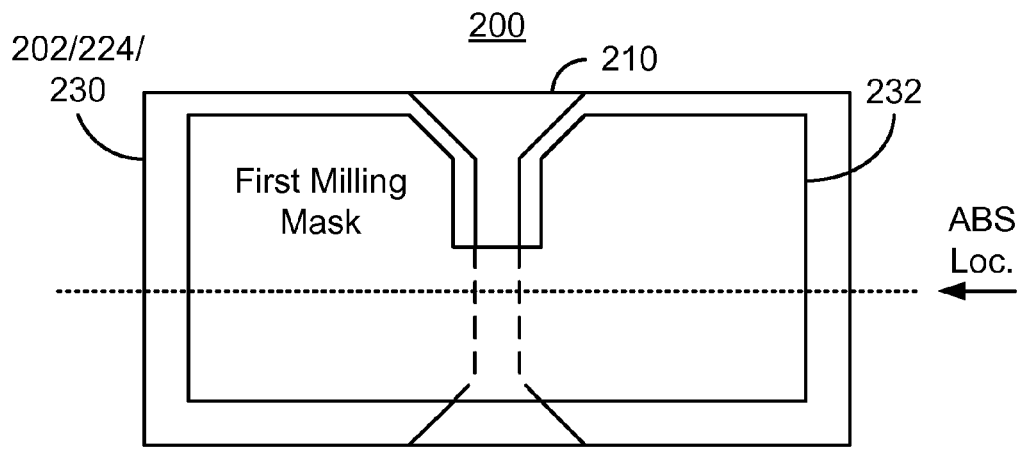
Figure 16:
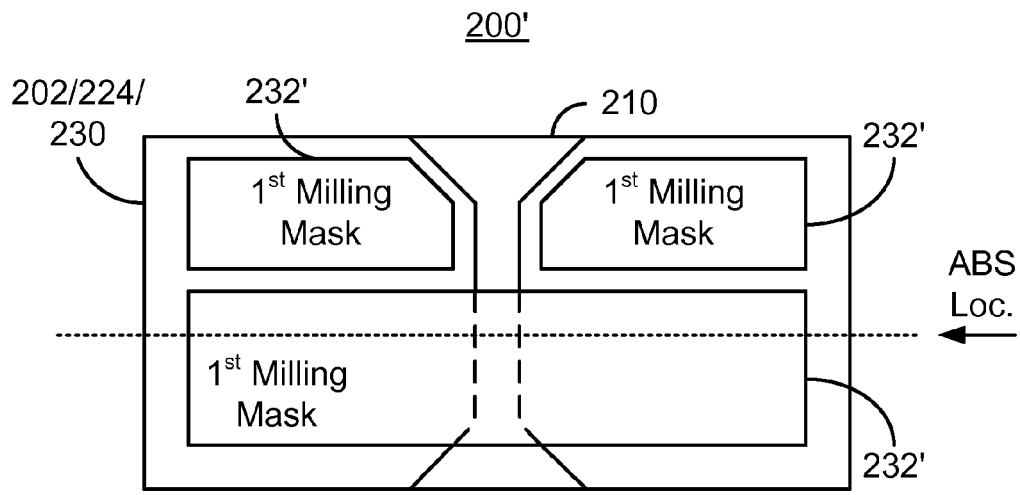

A first milling mask is provided, via step 186. The first milling mask may be a photoresist or other mask. The first milling mask is used to define the stripe height of the free layer 218. In addition, the first milling mask may be used to define the soft bias structures 230. FIGS. 15 and 16 depict plan views of two embodiments of the magnetic transducer 200 and 200', respectively, after step 186 is performed. FIG. 15 depicts the transducer 200 after one embodiment of a first milling mask 232 is provided. The first milling mask 232 covers the ABS location (the location at which the ABS will reside). Note that the first milling mask extends further from the ABS location in the region of the soft bias material(s) 230 than over the read sensor 210. Similarly, FIG. 16 depicts the transducer 200' after the first milling mask 232' has been formed. The first milling mask 232' includes multiple sections. One section covers both the read sensor 210 and the soft bias material(s) 230 in the region around the ABS location. The remaining portions cover parts of the hard bias material(s) 230 further from the ABS.

Figure 17:
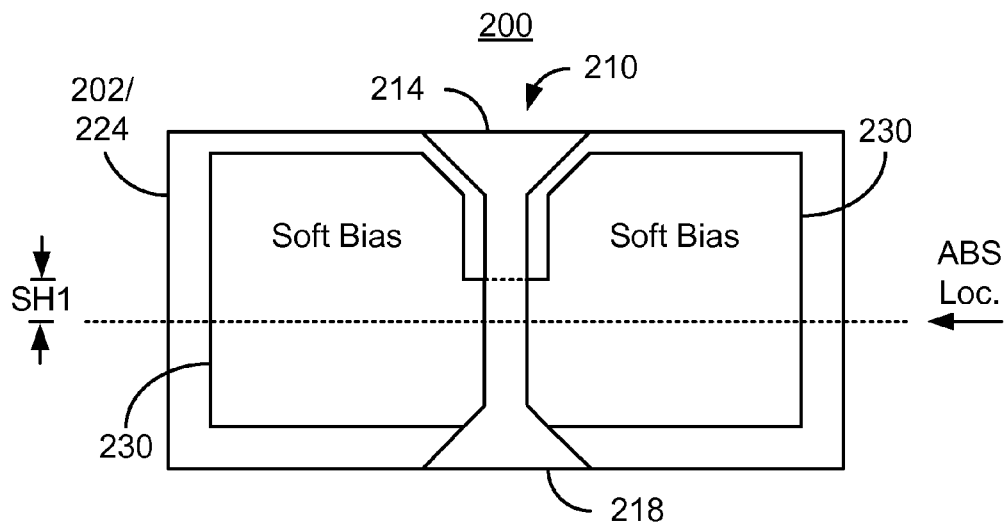
Figure 18:
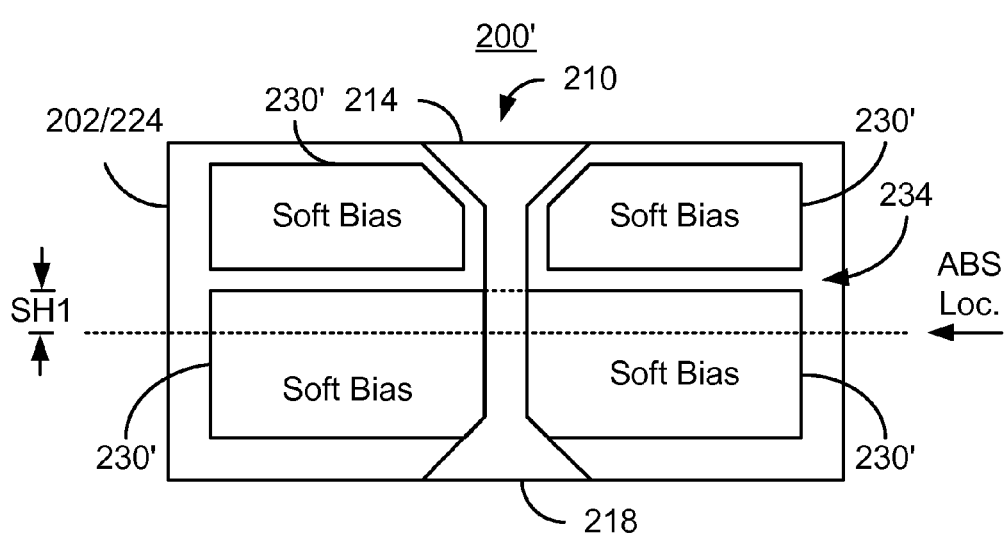

A first mill is performed, via step 188. The first mill removes at least the portion of the free layer 218 that is not covered by the first milling mask 232/232'. In addition, the part of the soft bias material(s) 230 not covered by the first milling mask 232/232' are milled. In some embodiments, the mill terminates at or in the nonmagnetic spacer layer 216. In other embodiments, the mill terminates at the pinned layer 214. In some embodiments, a small portion of the pinned layer 216 may be milled away. However, as the sensor 210 is desired to have an extended pinned layer, most of the pinned layer 210 remains. The first milling mask may be removed at the end of step 188. FIGS. 17 and 18 depict plan views of the magnetic read transducer 200/200' after step 188 is performed. Thus, the free layer 218 near the ABS location remains. The stripe height of the free layer 218, SH1 has been defined. A dashed line indicates the back edge of the free layer 218. The soft bias structures 230 and 230' remain in the transducer 200 and 200', respectively. The soft bias structures 230 extend past the free layer 218 stripe height SH1. Similarly, portions of the soft bias structure 230' reside past the stripe height SH1 of the free layer 218. These are separated by gap 234 from the portion of the soft bias structures 230' residing at the ABS location. These bias structures 230 and 230' were covered by the first milling mask 232 and 232', respectively. Consequently, all of the soft bias material remains in these regions. In some embodiments, the soft bias material is not completely removed by step 188 in the remaining locations.

Figure 19:
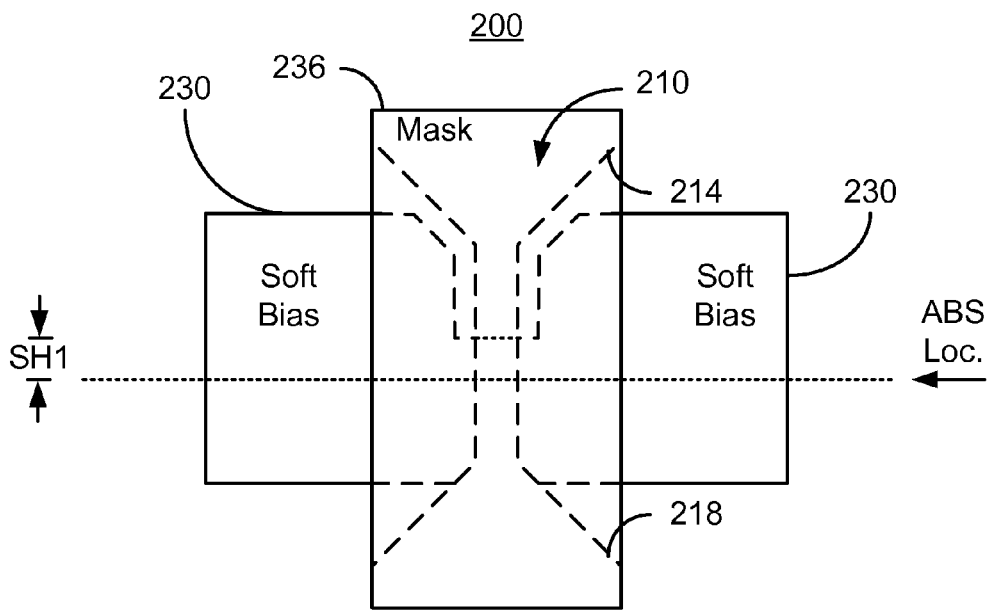
Figure 20:
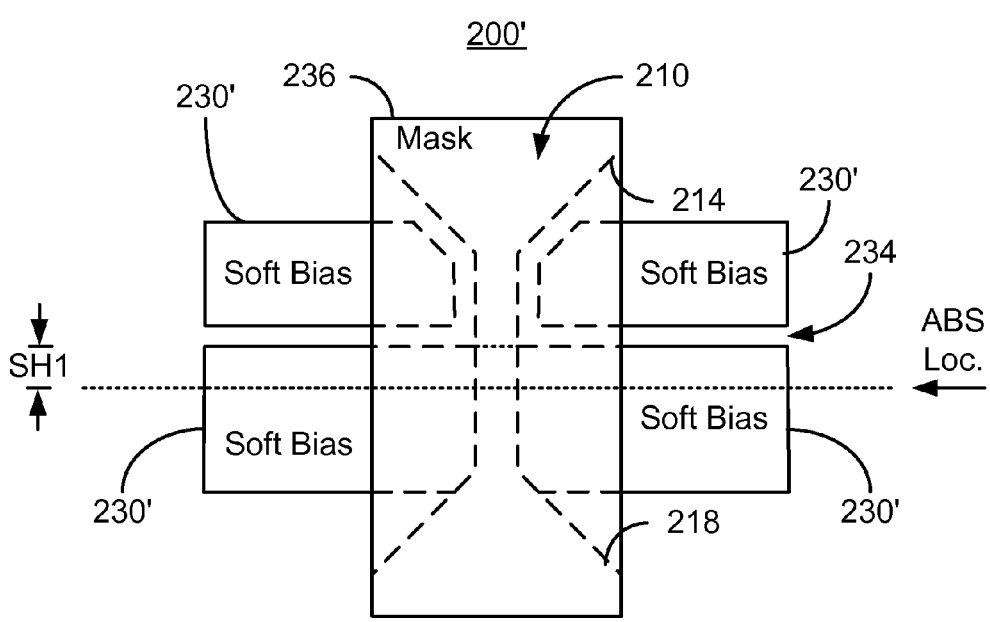

A second milling mask is provided, via step 190. The second milling mask may be a photoresist or other mask. The second milling mask is used to define the stripe height of the pinned layer 214. In addition, the second milling mask may be used to further define the soft bias structures 230. FIGS. 19 and 20 depict the magnetic transducers 200 and 200', respectively, after step 190 is performed. Thus, second milling mask 236 is shown. The second milling mask 236 is the same for both transducers 200 and 200'. In other embodiments, the second milling mask 236 may be different.

Figure 21:
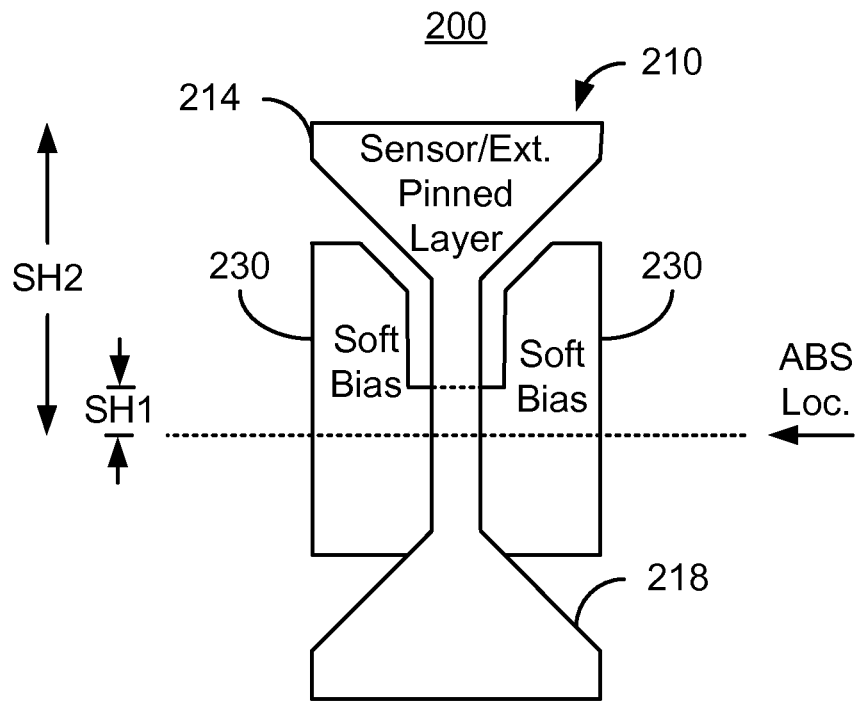
Figure 22:
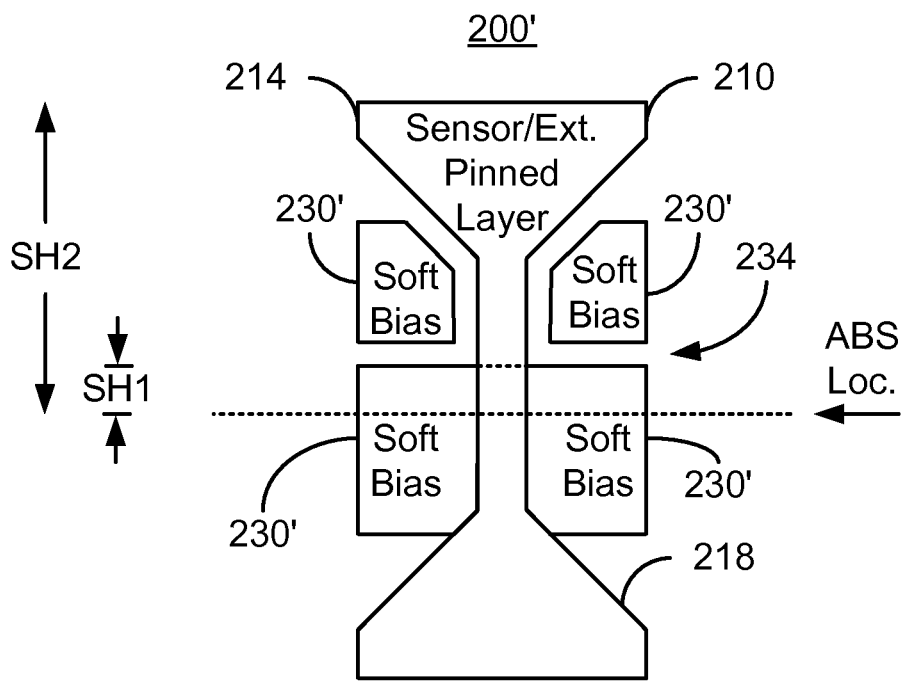

The second mill is performed, via step 192. The second mill removes the portion of the pinned layer 214 that is not covered by the second milling mask 236. In addition, the part of the soft bias material(s) 230 not covered by the first milling mask 236 are milled away. The second milling mask 236 may be removed at the end of step 192. FIGS. 21 and 22 depict plan views of the magnetic read transducer 200/200' after step 188 is performed. Thus, the portions of the soft bias structures 230 and 230' that were covered by both the first milling mask 232/232' and the second milling mask 236 remain in FIGS. 21 and 22.

Figure 23:
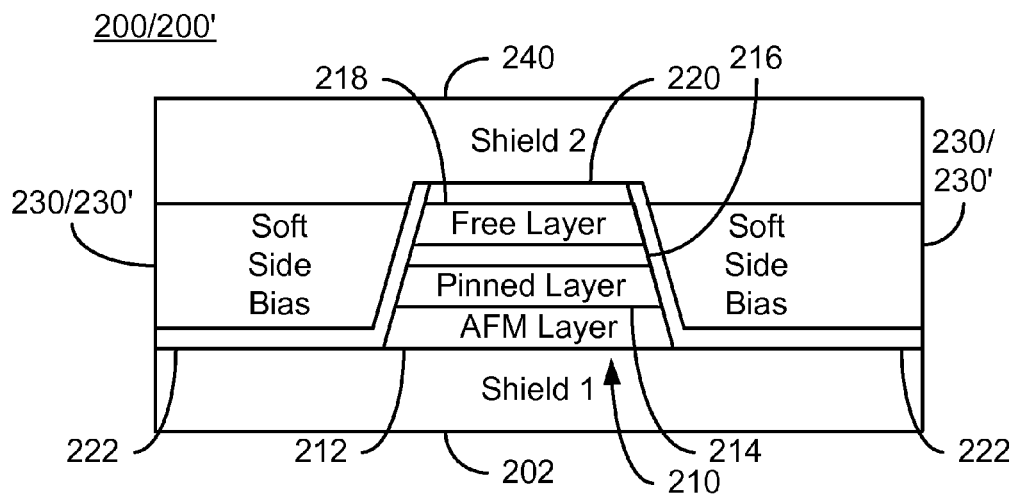
Figure 24:
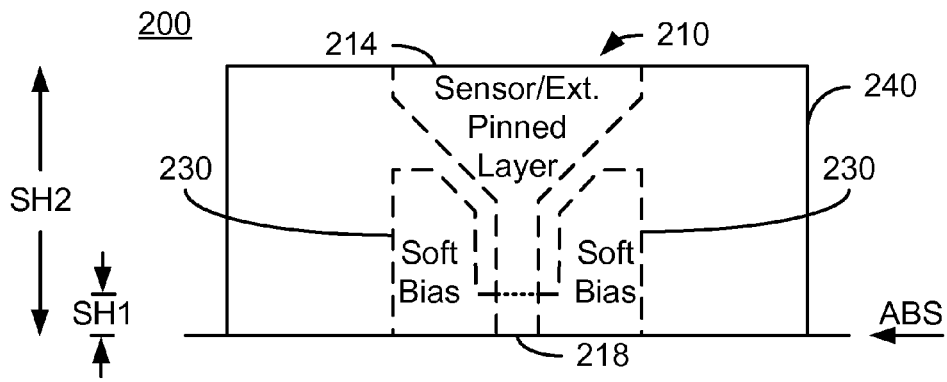
Figure 25:
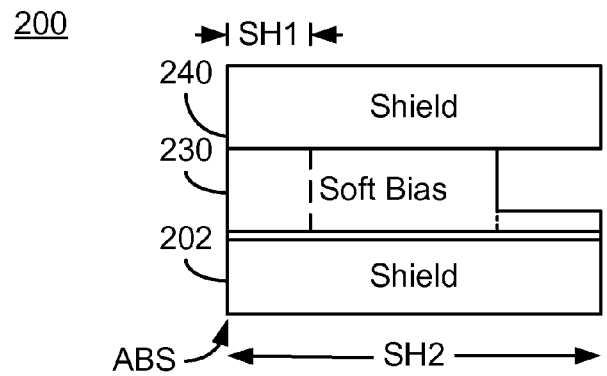
Figure 26:
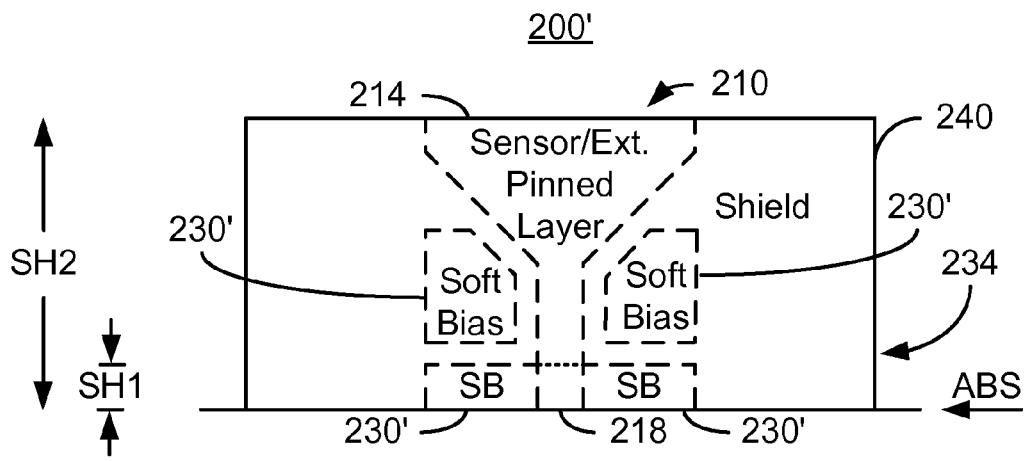
Figure 27:
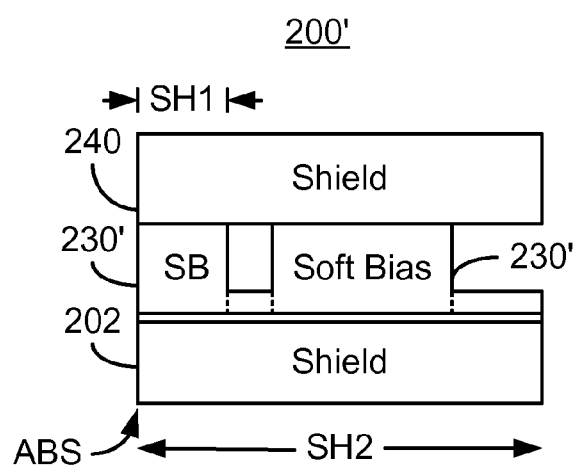

The second shield is provided, via step 194. Fabrication of the transducer may then be completed. FIG. 23 depicts an ABS view of the transducers 200/200' after step 194 is performed. FIGS. 24 and 25 depict plan and side views, respectively, of the transducer 200 after step 194 is performed. FIGS. 26 and 27 depict plan and side views, respectively, of the transducer 200' after step 194 is performed. In addition, the transducers 200 and 200' have been lapped, exposing the ABS at the ABS location. Thus, the shield 240 has been provided. The shield 240 is connected to the portions of the soft bias 230 and 230' closest to the sensor 210. In FIG. 25, the soft bias residue is shown as separated from the soft bias 230 by a dotted line and the stripe height indicated by the dashed line. Also in FIG. 27, soft bias residue remains between and behind the soft bias structures 230' and is shown as separated from the soft bias structures 230' by a dotted line.

The magnetic junctions 200 and 200' may have improved reliability. The soft bias structures 230 and 230' extend to the shield 240 in the down track direction and extend further from the ABS than the stripe height SH1. A significantly larger portion of the soft bias structures 230 and 230' are thus connected to the shield 240. As a result, the soft bias structures 230 and 230' are more stable. Further, the presence of residue may be reduced or eliminated. Stability and, therefore, reliability of the magnetic transducer is thus improved.

Using the method 170, the transducers 200 and/or 200' may be fabricated. The method 170 may also be used for fabricating the transducers 100, 100', 100'', 100''', and/or 100''''. Thus, the benefits of one or more of the transducers 100, 100', 100'', 100''', 100'''', 200 and/or 200' may be achieved.

We claim:

1. A magnetic transducer having an air-bearing surface (ABS) and comprising:
   a first shield;
   a read sensor including a sensor layer, a pinned layer and at least one edge, the sensor layer having a first stripe height in a stripe height direction perpendicular to the ABS, the pinned layer having a second stripe height in the stripe height direction perpendicular to the ABS, the second stripe height being greater than the first stripe height;
   at least one soft magnetic bias structure adjacent to the at least one edge, a portion of the at least one soft magnetic bias structure being further from the ABS than the first stripe height; and
   a second shield, the read sensor residing between the first shield and the second shield, the at least one soft magnetic bias structure extending to the second shield.

2. The magnetic transducer of claim 1 further comprising:
   an insulating layer residing between the at least one soft magnetic bias structure and the read sensor.

3. The magnetic read transducer of claim 1 wherein the at least one soft magnetic bias structure includes a first portion and a second portion, the first portion having a surface at the ABS and the first stripe height from the ABS, the second portion separated by a gap in the stripe height direction from the first portion.

4. The magnetic read transducer of claim 1 wherein the at least one soft magnetic bias structure includes a portion extending from the ABS, further than the first stripe height and not further than the second stripe height.

5. A disk drive comprising:
a media;
a slider including a magnetic read transducer having an air-bearing surface (ABS), the magnetic read transducer including a first shield, a read sensor, a second shield, at least one soft magnetic bias structure and a second shield, the read sensor residing between the first shield and the second shield, the read sensor including at least one edge in a track width direction along the ABS, a sensor layer and a pinned layer, the sensor layer having first stripe height in a stripe height direction perpendicular to the ABS, the pinned layer having a second stripe height in the stripe height direction perpendicular to the ABS, the second stripe height being greater than the first stripe height, the at least one soft magnetic bias structure being adjacent to the at least one edge, a portion of the at least one soft magnetic bias structure being a distance from the ABS greater than the first stripe height, the at least one soft magnetic bias structure extending to the second shield.

6. A method for providing a magnetic read transducer having an air-bearing surface (ABS) comprising:
providing a first shield;
providing a read sensor including a sensor layer, a pinned layer and at least one edge, the sensor layer having a first stripe height in a stripe height direction perpendicular to the ABS, the pinned layer having a second stripe height in the stripe height direction, the second stripe height being greater than the first stripe height;
providing at least one soft magnetic bias structure adjacent to the at least one edge, a portion of the at least one soft magnetic bias structure being a distance from the ABS greater than the first stripe height; and
providing a second shield, the read sensor residing between the first shield and the second shield, the at least one soft magnetic bias structure extending to the second shield.

7. The method transducer of claim 6 wherein the step of providing the read sensor further includes:
blanket depositing a plurality of read sensor layers including a blanket sensor layer corresponding to the sensor layer and a blanket pinned layer corresponding to the pinned layer;
providing a mask covering a portion of the read sensor layers; and
removing an exposed portion of the read sensor layer, thereby defining the read sensor in a track width direction.

8. The method of claim 7 wherein the step of providing the at least one soft bias structure further includes:
depositing at least one soft bias material for the at least one soft bias structure after the read sensor is defined in the track width direction; and
removing the mask after at least one soft bias material is deposited.

9. The method of claim 8 wherein the step of providing the read sensor further includes:
providing a first milling mask the first milling mask covering the ABS, a first portion of the first milling mask residing over the read sensor and extending not further from the ABS than the first stripe height, a second portion of the first milling mask covering a portion of the at least one soft bias material and extending further from the ABS than the first stripe height; and
milling the plurality of read sensor layers and the at least one soft bias material such that the sensor layer extends not further than the first stripe height, such that the portion of the at least one soft bias structure extends further from the ABS than the first stripe height and such that a remaining portion of the blanket pinned layer is not milled.

10. The method of claim 9 wherein the first milling mask has a first mask portion corresponding to a first portion of the at least one soft bias structure and a second mask portion corresponding to a second portion of the at least one soft bias structure, a gap residing between the first mask portion and the second mask portion, the second mask portion residing further from the ABS than the first stripe height.

11. The method of claim of claim 9 wherein the step of providing the read sensor further includes:
providing a second milling mask covering part of the remaining portion of the blanket pinned layer and another portion of the at least one soft bias material; and
milling the remaining portion of the blanket pinned layer and the at least one soft bias material such that the pinned layer has the second stripe height.

12. The method of claim 6 further comprising:
providing an insulating layer residing between the at least one soft magnetic bias structure and the read sensor.

13. The method of claim 6 wherein the at least one soft magnetic bias structure includes a first portion and a second portion, the first portion having a surface at the ABS and the first stripe height from the ABS, the second portion separated by a gap in the stripe height direction from the first portion.

14. The method of claim 6 wherein the at least one soft magnetic bias structure includes a portion extending from the ABS in the stripe height direction further than the first stripe height and not further than the second stripe height.

* * * * *